(12) United States Patent
Lee

(10) Patent No.: US 7,703,941 B2
(45) Date of Patent: Apr. 27, 2010

(54) EXPANDABLE LED MODULE FOR ARBITRARILY DISPLAY ASSEMBLY

(76) Inventor: Ching Chuan Lee, 6F-3, No. 123, Lane 235, Baociao Rd., Sindian City, Taipei Country (TW)

( * ) Notice: Subject to any disclaimer, the term of this patent is extended or adjusted under 35 U.S.C. 154(b) by 8 days.

(21) Appl. No.: 12/125,986

(22) Filed: May 23, 2008

(65) Prior Publication Data

US 2009/0267533 A1      Oct. 29, 2009

(30) Foreign Application Priority Data

Apr. 29, 2008   (CN) .................. 2008 2 0104903 U

(51) Int. Cl.
*F21S 4/00* (2006.01)
(52) U.S. Cl. .................. 362/219; 362/652; 362/225; 362/559; 362/217.17; 362/640
(58) Field of Classification Search .............. 362/640, 362/225, 646, 652, 659, 800, 145, 147, 559, 362/812, 219, 217.17
See application file for complete search history.

(56) References Cited

U.S. PATENT DOCUMENTS 4,439,818 A * 3/1984 Scheib ................. 362/249.06
4,639,841 A * 1/1987 Salestrom et al. ........... 362/227
5,337,225 A * 8/1994 Brookman ................. 362/145
5,559,681 A * 9/1996 Duarte ....................... 362/231
6,183,104 B1 * 2/2001 Ferrara ....................... 362/145
6,536,924 B2 * 3/2003 Segretto ..................... 362/345
6,659,622 B2 * 12/2003 Katogi et al. ............... 362/219
7,470,055 B2 * 12/2008 Hacker et al. ............... 362/640

* cited by examiner

*Primary Examiner*—Jacob Y Choi
(74) *Attorney, Agent, or Firm*—Ming Chow; Sinorica, LLC

(57) ABSTRACT

An expandable LED module for arbitrary display assembly, comprises: a print circuit board, used to carry the following devices; at least a light emitting diode, disposed on said print circuit board; a first connecting device, disposed on one side of said print circuit board and coupled to said light emitting diode; and a second connecting device, disposed on the other side of said print circuit board, coupled to said light emitting diode, and capable of interconnecting with said first connecting device, wherein said first connecting device and second connecting device can be utilized to expand said LED modules to accomplish any assembly indicating figures, words, numbers, or symbols.

8 Claims, 10 Drawing Sheets

EXPANDABLE LED MODULE FOR ARBITRARILY DISPLAY ASSEMBLY

BACKGROUND OF THE INVENTION

1. Field of the Invention

The present invention relates to an expandable LED module for arbitrary display assembly, and more particularly relates to an expandable LED module, which can be connected to one another through connectors to accomplish any assembly indicating figures, words, numbers, or symbols.

2. Description of the Related Art

At present, the common light emitting diode (LED) bars have a plurality of LED's, and a layer of glue on the bottom for sticking on the buildings to provide decoration or illumination in the nights. Through the control of an external controller, the assembled LED's can display varying lighting patterns.

However, said LED bars, being in bar shape, the assembly of which is limited to shapes like square, circle, diamond, triangle, etc. Besides, said bar-shaped LED's are usually packaged in serial lines when delivered from the factories, so the users have to cut them according to the length needed, and then assembly them to the wanted shape; once the length is decided and cut, then it is not changeable, especially not expandable, so, when the cut length is not sufficient, it may become unavailable and cause a waste. These are the cons of the known art.

SUMMARY OF THE INVENTION

In view of the description above, an objective of the present invention is to overcome the shortcomings of the bar-shaped LED's and provide a novel expandable LED module for arbitrary display assembly.

The present novel expandable LED module for arbitrary display assembly can be connected to one another through connectors to accomplish any assembly indicating figures, words, numbers, or symbols.

An expandable LED module for arbitrary display assembly, includes: a print circuit board, used to carry the following devices; at least a light emitting diode, disposed on said print circuit board; a first connecting device, disposed on one side of said print circuit board and coupled to said light emitting diode; and a second connecting device, disposed on the other side of said print circuit board, coupled to said light emitting diode, and capable of interconnecting with said first connecting device, wherein said first connecting device and second connecting device can be utilized to expand said LED modules to accomplish any assembly indicating figures, words, numbers, or symbols.

To make it easier for our examiner to understand the objective of the invention, its structure, innovative features, and performance, we use a preferred embodiment together with the attached drawings for the detailed description of the invention.

BRIEF DESCRIPTION OF THE DRAWINGS

FIG. 5 is a schematic illustration of several shapes that the present invention is assembled in;

DETAILED DESCRIPTION OF THE PREFERRED EMBODIMENTS

The present invention will now be described in more detail hereinafter with reference to the accompanying drawings that show various embodiments of the invention.

Figure 1A:
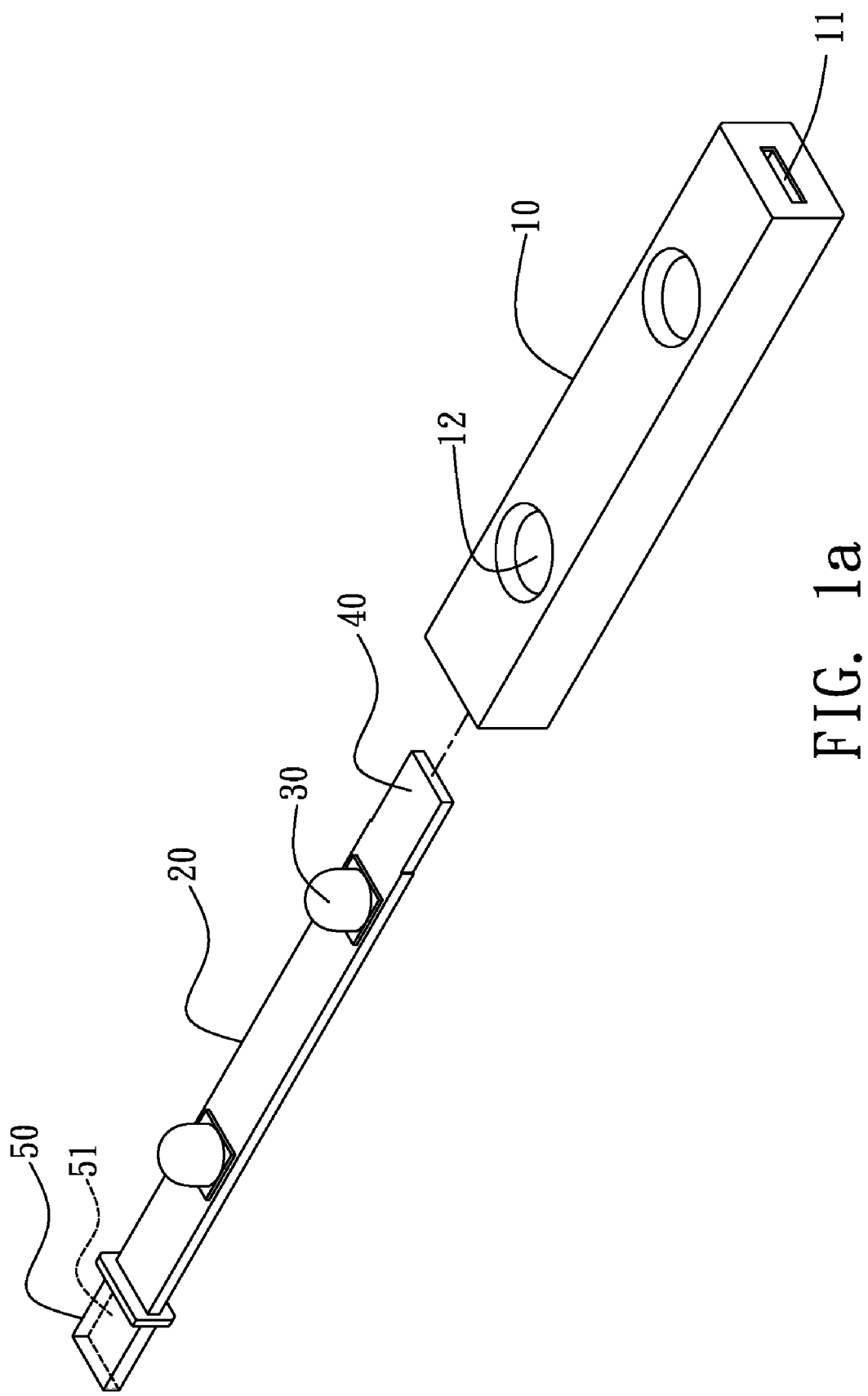
FIGS. 1(a) and 1(b) are exploded views of a preferred embodiment of the present invention.
Figure 1B:
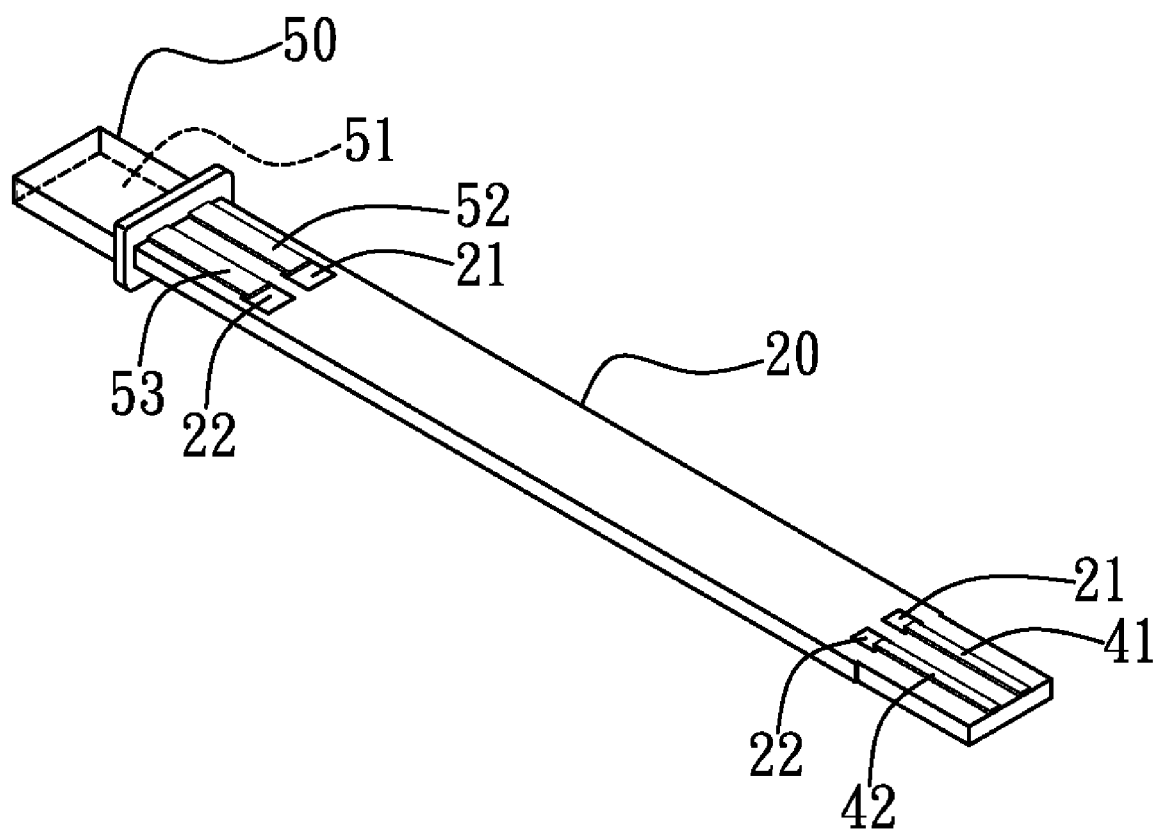
Figure 2:
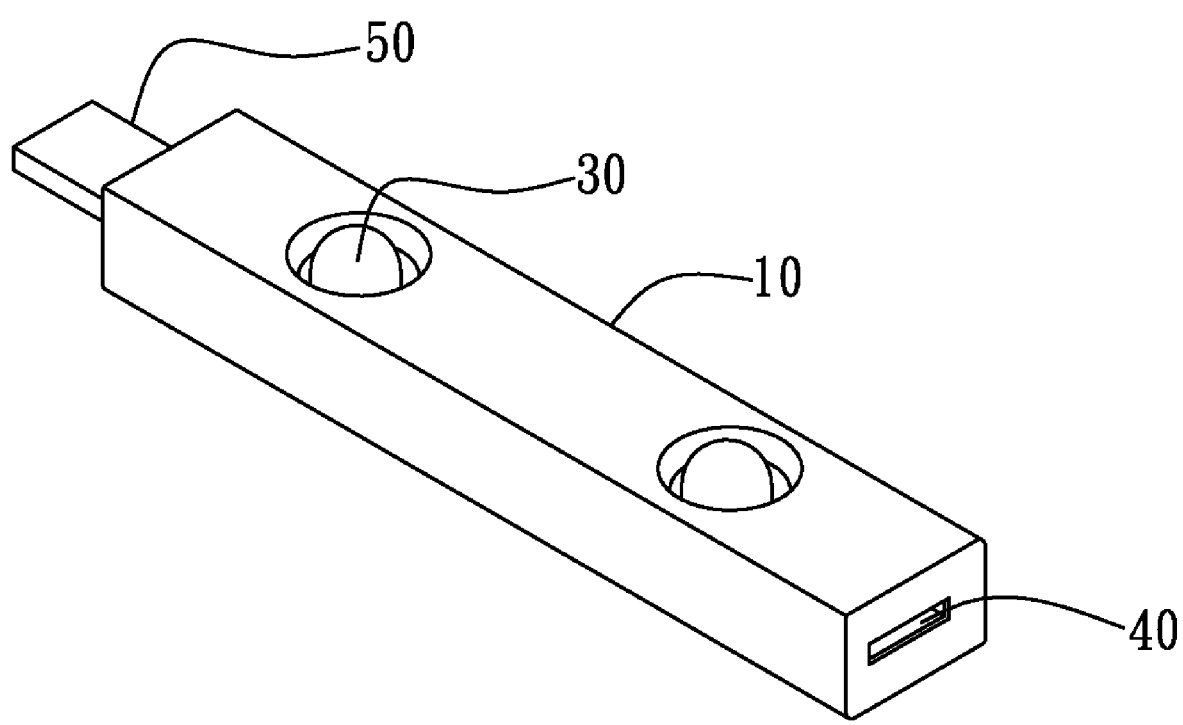
FIG. 2 is an assembly schematic illustration of a preferred embodiment of the present invention.

FIG. 1 (a) shows an exploded view of the present novel expandable LED module; FIG. 1 (b) illustrates the print circuit board, first connecting device, and second connecting device of the present invention; FIG. 2 shows the schematic drawing of the present novel expandable LED module.

As indicated in the drawings, the present novel expandable LED module includes: a housing 10; a print circuit board 20; at least a light emitting diode 30; a first connecting device 40; and a second connecting device 50.

Wherein, said housing 10, made of insulating material, which can be but not limited to plastics, has a room 11 open in both sides to provide the space for said print circuit board 20, and a through hole 12 for said light emitting diode 30 to be exposed.

Said print circuit board 20, disposed in said room 11, used to carry said light emitting diode 30, a first connecting device 40, and a second connecting device 50, has at least a positive polarity pad 21, a negative polarity pad 22, and circuit traces (not shown in the drawing) for coupling to said light emitting diode 30, and the shape of said print circuit board 20 can be but not limited to bar type, ⊥type, type, or ⊓type, etc.

Said light emitting diode 30 is disposed on said print circuit board 20 and exposed from said through hole 12. Besides, the number of said light emitting diode 30 and though hole 12 can be changed for different needs, and said light emitting diode 30 can be but not limited to a mono color or full colors LED. When said light emitting diode 30 is a common cathode full colors LED, it will need three positive polarity pads 21 for the red, green, and blue respectively, a negative polarity pad 22, and circuit traces (not shown in the drawing). In this embodiment, a mono color LED is taken as an example, and should not be limited thereto.

Said first connecting device 40 having a positive polarity contact 41 and a negative polarity contact 42, which can be but not limited to the golden finger, is disposed on, for example but not limited to, the right side of said print circuit board 20, and is coupled to said light emitting diode 30, wherein said positive polarity contact 41 and negative polarity contact 42 are coupled through said positive polarity pad 21 and negative polarity pad 22 respectively to said light emitting diode 30, and the number of the contacts is equal to that of the pads in both polarity.

Said second connecting device 50 having a slot 51 and a positive polarity contact 52 and a negative polarity contact 53 therein, is disposed on, for example but not limited to, the left side of said print circuit board 20, wherein said positive polarity contact 52 and negative polarity contact 53 are extended to the outside of said second connecting device 50 and coupled through said positive polarity pad 21 and negative polarity pad 22 respectively to said light emitting diode 30, and the number of the contacts is equal to that of the pads in both polarity.

When it comes to assembly, the first step is to stick said light emitting diode 30 and said second connecting device 50 to said print circuit board 20, and then put said print circuit board 20 into said housing 10 to finish the assembly of the present novel expandable LED module.

Figure 3A:
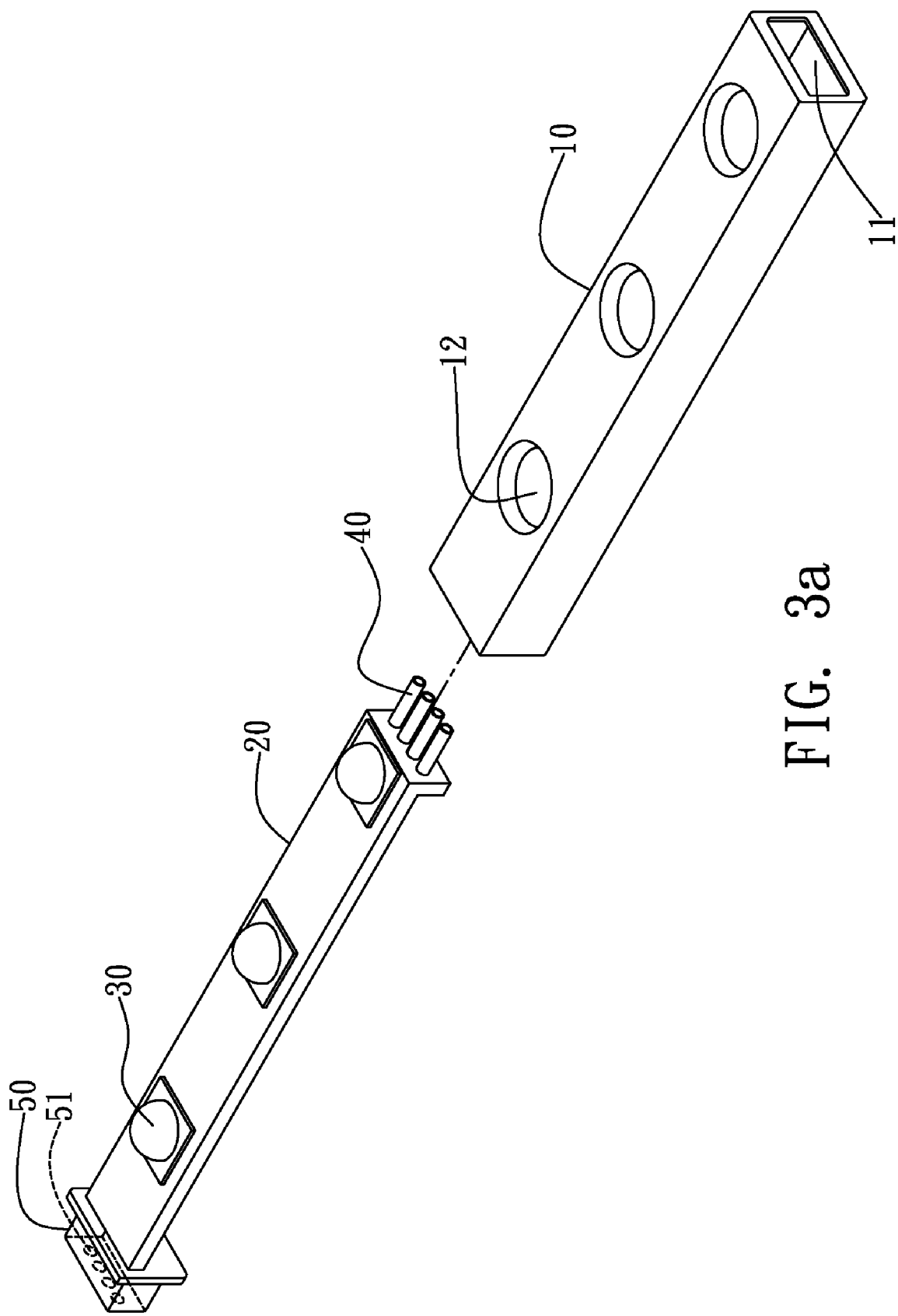
FIGS. 3(a) and 3(b) are exploded views of another preferred embodiment of the present invention.
Figure 3B:
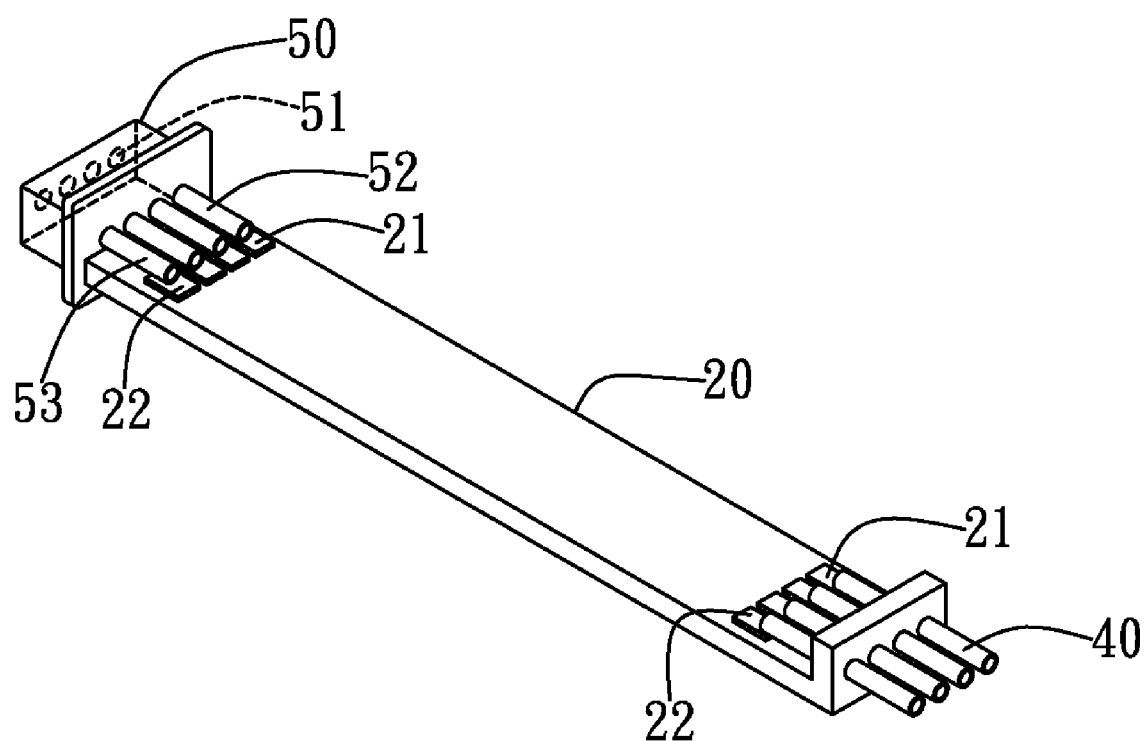
Figure 4:
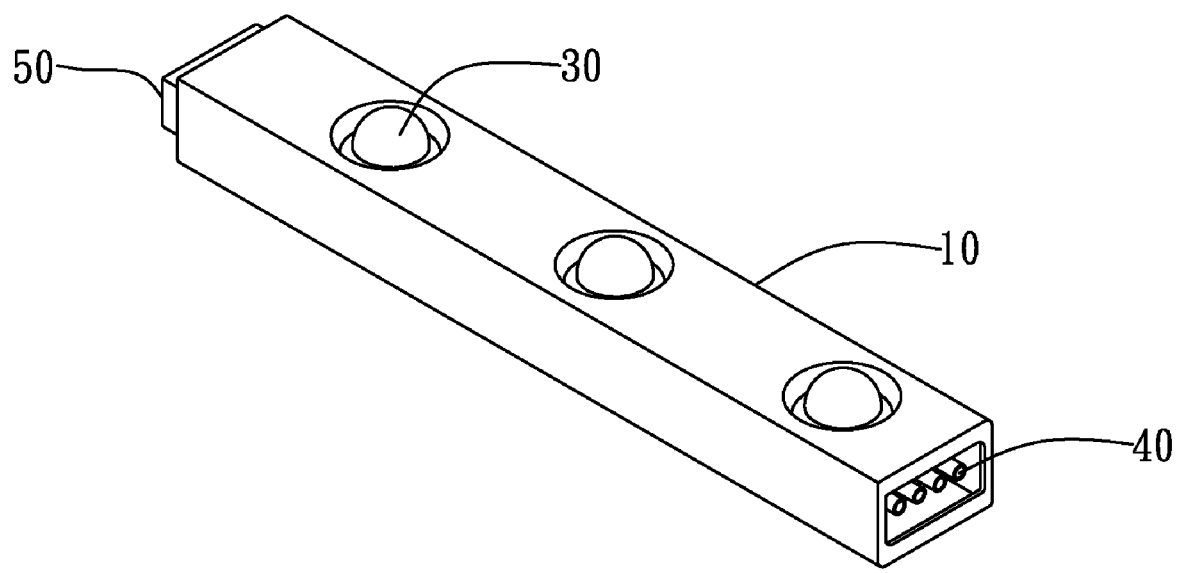
FIG. 4 is an assembly schematic illustration of another preferred embodiment of the present invention.

Refer to FIGS. 3 and 4, wherein FIG. 3(a) shows the exploded view of another embodiment of present invention; FIG. 3(b) shows the illustrating view of the rear sides of a print circuit board, a first connecting device, and a second connecting device of another embodiment of present invention; FIG. 4 is an assembly illustrating view.

As indicated in the drawings, said first connecting device 40 of the present novel expandable LED module can be a pin header, and said second connecting device 50 has a slot 51 and a positive polarity contact 52 and a negative polarity contact 53 therein, wherein said positive polarity contact 52 and negative polarity contact 53 can be pins and are extended to the outside of said second connecting device 50 and coupled through said positive polarity pad 21 and negative polarity pad 22 respectively to said light emitting diode 30.

When it comes to assembly, the first step is to stick said light emitting diode 30 and said second connecting device 50 to said print circuit board 20, and then put said print circuit board 20 into said housing 10 to finish the assembly of the present novel expandable LED module.

Figure 5:
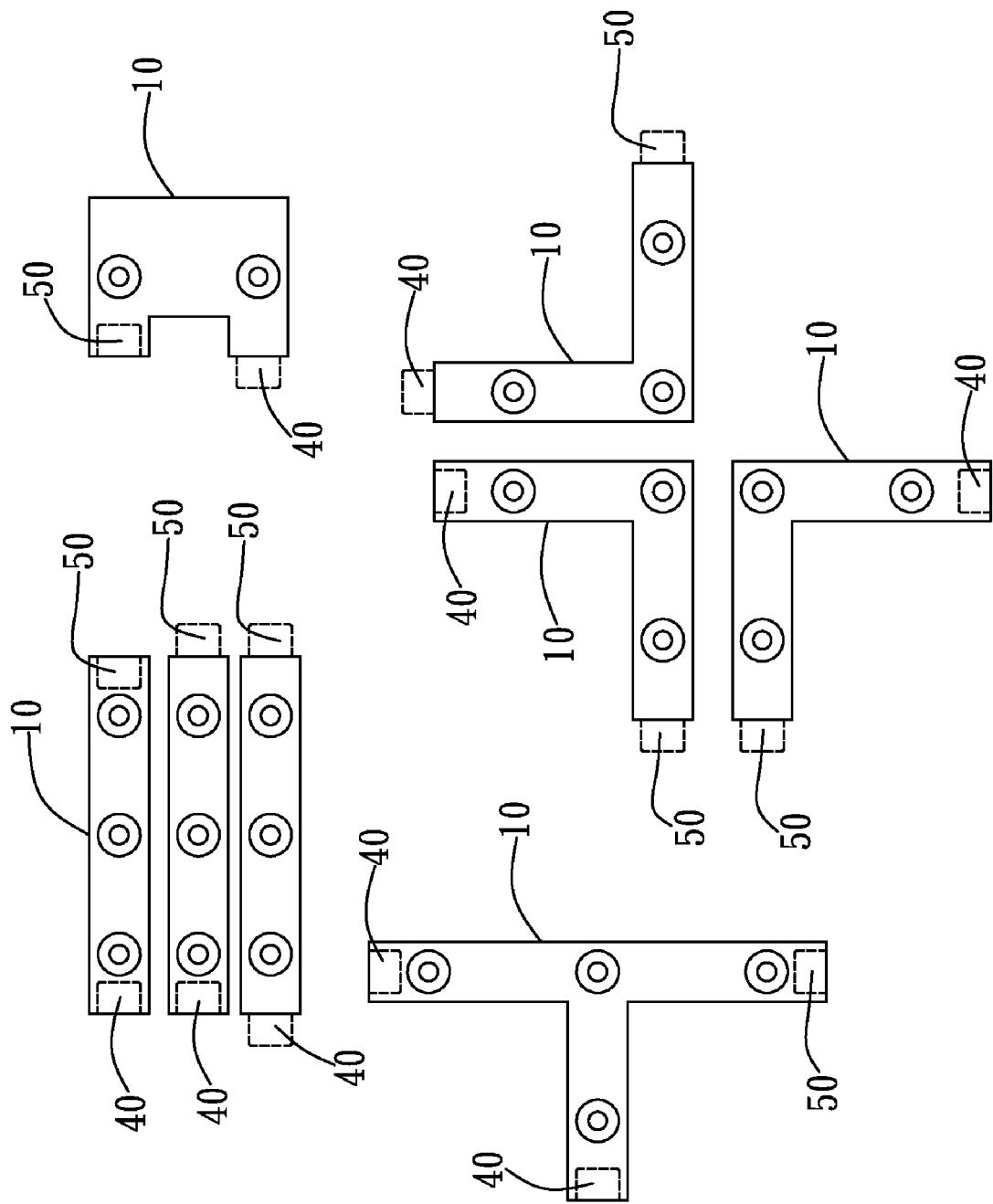
Figure 6E:
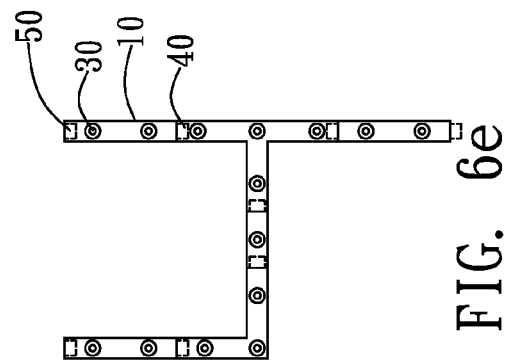
FIG. 6(a)-6(j) are schematic illustration that the present invention can be expanded to become arbitrary assembly indicating figures, words, numbers, or symbols.
Figure 6D:
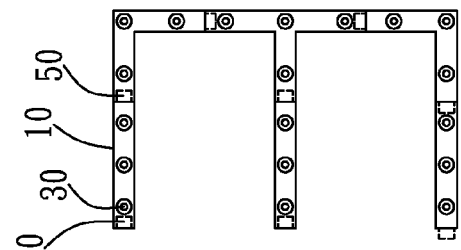
Figure 6C:
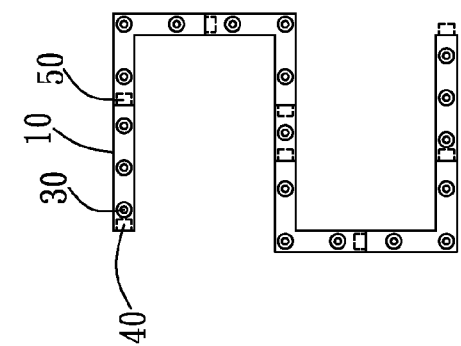
Figure 6B:
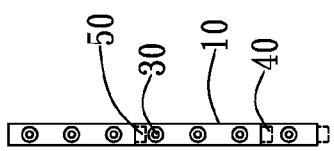
Figure 6A:
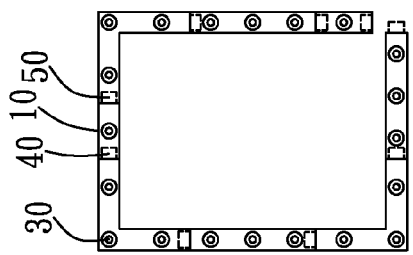
Figure 6J:
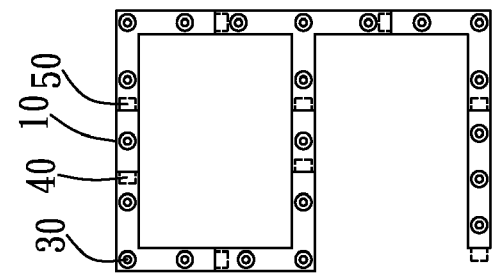
Figure 6I:
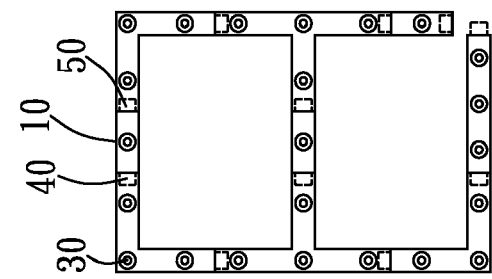
Figure 6H:
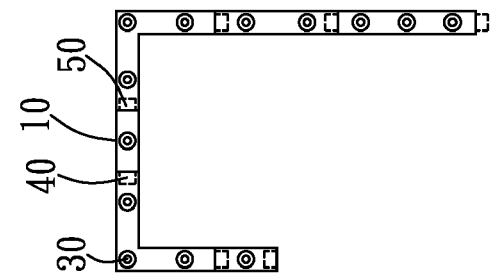
Figure 6G:
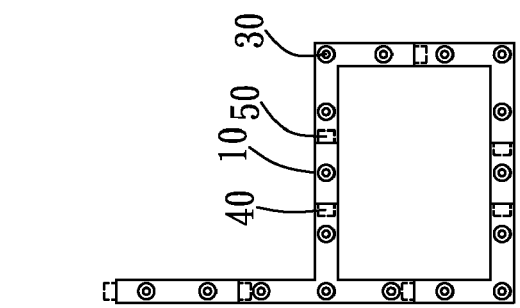
Figure 6F:
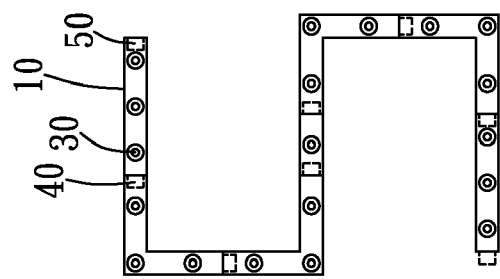

Refer to FIGS. 5 and 6(a)~6(i), wherein FIG. 5 indicates that the shape of the present novel expandable LED module can be bar type, L type, ⊥type, or ⊓type; FIG. 6(a)~6(i) indicates respectively that the present novel expandable LED module can be expanded to assemble any figures, words, numbers, or symbols.

As indicated in the drawing of FIG. 5, the shape of the housing 10 and print circuit board 20 of the present novel expandable LED module can be bar type, L type, ⊥type, or ⊓type, wherein said first connecting device 40 and second connecting device 50 can be located in said housing 10, but not limited thereto, in the following manners: said first connecting device 40 is hiding in said housing 10, and said second connecting device 50 is exposed outside said housing 10; said first connecting device 40 is hiding in said housing 10, and said second connecting device 50 is hiding in said housing 10; said first connecting device 40 is exposed outside said housing 10, and said second connecting device 50 is exposed outside said housing 10.

Through said first connecting device 40 and second connecting device 50 which are hiding in or exposed outside said housing 10, the present novel expandable LED module can be expanded to become any assembly indicating figures, words, numbers, or symbols, for example, like the numbers 0, 1, 2, 3, 4, 5, 6, 7, 8, 9 shown in FIG. 6(a)~6(i). Therefore, the present invention has overcome the shortcomings of the known ones.

Figure 7:
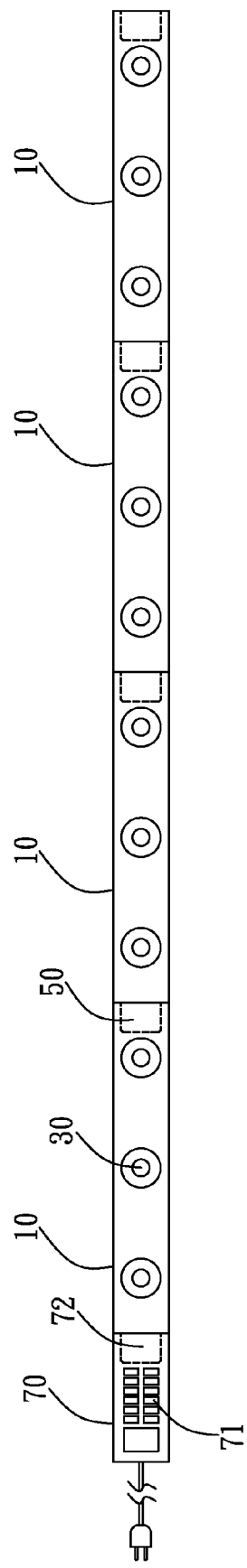
FIG. 7 is a schematic illustration that the present invention can further connect to an external control box.

Refer to FIG. 7 indicating an illustration that the present novel expandable LED module can further connect to an external control box. As shown in the drawing, the present novel expandable LED module can further connect to an external control box 70 having at least a controller 71 and a connector 72, wherein through the connection of said connector 72 with said first connecting device 40 or second connecting device 50, said controller 71 can control the colors and lighting time of said light emitting diode 30.

So, through the implementation of the present invention, any display assembly indicating figures, words, numbers, or symbols can be achieved.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance than the conventional structure and further complies with the patent application requirements and is submitted to the Patent and Trademark Office for review and granting of the commensurate patent rights.

What is claimed is:

1. An expandable LED module for arbitrary display assembly, comprising:
    a housing;
    a print circuit board;
    at least one light emitting diode being disposed on said print circuit board;
    said print circuit board has at least one positive polarity pad, one negative polarity pad, and circuit traces for coupling to said at least one light emitting diode;
    a first connecting device being disposed on one side of said print circuit board and being coupled to said at least one light emitting diode;
    the first connecting device has a positive polarity contact and a negative polarity contact connecting with said positive polarity pad and the negative polarity pad respectively, and the first connecting device coupling to said at least one light emitting diode;
    a second connecting device being disposed on another side of said print circuit board and being coupled to said at least one light emitting diode;
    said second connecting device comprises a positive polarity contact and a negative polarity contact connecting respectively with said positive polarity pad and negative polarity pad, and the second connecting device coupling to said at least one light emitting diode;
    said second connecting device interconnecting with said first connecting device, wherein the interconnecting of said first connecting device and second connecting device expanding said expandable LED module;
    the expandable LED module displays figures, words, numbers, or symbols;
    wherein said first connecting device is a gold finger or pin header;
    wherein said second connecting device comprises a slot;
    the positive polarity contact and the negative polarity contact of the second connecting device both extending outside of said second connecting device; and
    a housing having a room open in two sides to provide a placement for said print circuit board;
    a plurality of through holes on a surface of said housing for said at least one light emitting diode to be exposed.

2. The expandable LED module for arbitrary display assembly as claimed in claim 1, wherein a shape of said print circuit board is bar type, L type, ⊥ type, or ⊓ type.

3. The expandable LED module for arbitrary display assembly as claimed in claim 1, wherein said at least one light emitting diode is a mono color or a full colors LED.

4. The expandable LED module for arbitrary display assembly as claimed in claim 1, wherein said first connecting device is enclosed in said housing, and said second connecting device is positioned outside of said housing.

5. The expandable LED module for arbitrary display assembly as claimed in claim 1, wherein both said first connecting device and second connecting device are enclosed in said housing.

6. The expandable LED module for arbitrary display assembly as claimed in claim 1, wherein both said first connecting device and second connecting device are positioned outside of said housing.

7. The expandable LED module for arbitrary display assembly as claimed in claim 1, comprises a control box having at least a controller and a connector;
  said connector connects with said first connecting device or said second connecting device through a connection;
  said controller controls colors and lighting time of said at least one light emitting diode.

8. The expandable LED module for arbitrary display assembly as claimed in claim 1, wherein said housing is made of insulating material; and
  a shape of the housing is a bar type, ⌊, ⊥ type, or ⊓ type to accommodate said print circuit board.

* * * * *